United States Patent
Chen et al.

(10) Patent No.: US 7,082,587 B2
(45) Date of Patent: Jul. 25, 2006

(54) METHOD OF ESTIMATING PATH DELAYS IN AN IC

(75) Inventors: Pinhong Chen, Fremont, CA (US); Chin-Chi Teng, Sunnyvale, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 202 days.

(21) Appl. No.: 10/323,399

(22) Filed: Dec. 18, 2002

(65) Prior Publication Data

US 2003/0140325 A1 Jul. 24, 2003

Related U.S. Application Data

(60) Provisional application No. 60/342,009, filed on Dec. 18, 2001.

(51) Int. Cl.
*G06F 17/50* (2006.01)

(52) U.S. Cl. .............................. 716/6; 716/4
(58) Field of Classification Search ................... 716/6, 716/4
See application file for complete search history.

(56) References Cited

U.S. PATENT DOCUMENTS

| | | | |
|---|---|---|---|
| 5,379,232 A * | 1/1995 | Komoda | 703/15 |
| 5,515,291 A * | 5/1996 | Omori et al. | 716/6 |
| 5,617,325 A * | 4/1997 | Schaefer | 716/6 |
| 5,638,294 A * | 6/1997 | Sasada | 716/5 |
| 5,654,898 A | 8/1997 | Roetcisoender et al. | |
| 5,754,826 A | 5/1998 | Gamal et al. | |
| 5,841,672 A * | 11/1998 | Spyrou et al. | 716/6 |
| 5,896,300 A * | 4/1999 | Raghavan et al. | 716/10 |
| 5,901,063 A * | 5/1999 | Chang et al. | 716/4 |
| 6,182,269 B1 * | 1/2001 | Laubhan | 716/5 |
| 6,381,730 B1 * | 4/2002 | Chang et al. | 716/5 |
| 6,415,426 B1 * | 7/2002 | Chang et al. | 716/9 |
| 6,557,145 B1 | 4/2003 | Boyle et al. | |
| 6,643,831 B1 * | 11/2003 | Chang et al. | 716/4 |
| 6,854,099 B1 * | 2/2005 | Dewey et al. | 716/5 |

* cited by examiner

*Primary Examiner*—A. M. Thompson
(74) *Attorney, Agent, or Firm*—Daniel J. Bedell; Smith-Hill and Bedell (57) ABSTRACT

To estimate path delays within an IC, a serial database is first created to hold and read out RC extraction data for nets within the IC in an order in which the RC extraction data will be needed when estimating path delays. Thereafter, as the RC extraction data is sequentially read out of the database for each net, the path delay though each section of the net is computed and added to the estimated path delay for each signal path including that net section. The RC extraction data for each net is accessed and accessed only once, thereby minimizing the processing time needed to perform timing analysis by minimizing hard disk read accesses when the RC extraction database resides on a hard disk.

16 Claims, 4 Drawing Sheets

METHOD OF ESTIMATING PATH DELAYS IN AN IC

CROSS-REFERENCE TO RELATED APPLICATIONS

The present application claims the benefit of the filing date of U.S. Provisional Application No. 60/342,009 entitled SEQUENTIAL DELAY CALCULATION, filed Dec. 18, 2001.

BACKGROUND OF THE INVENTION

1. Field of the Invention

The present invention relates in general to computer-based methods for designing and analyzing integrated circuit (IC) layouts and in particular to a method for estimating time delays through signal paths of an IC layout.

2. Description of Related Art

An IC designer typically produces an IC design in the form of a netlist referencing cells (circuit components) to be included in the IC and indicating how the cell terminals are to be interconnected to one another and to the IC's input/output (I/O) terminals through conductors (nets) within the IC. A cell library describes each kind of cell that may be included in the IC design, and the netlist indicates the nature of each cell to be included in the IC by referencing the entry in the cell library for that particular type of cell.

While the netlist references cells to be included in the IC and indicates which of their terminals are to be interconnected, it does not indicate where or how each cell is to be placed or oriented in an IC layout and does not indicate how the nets are to be routed between the cell and I/O terminals they are to interconnect. Therefore, after producing the netlist, an IC designer usually employs a computer-aided placement and routing (P&R) tool to detail the IC's layout by indicating how each cell referenced by the netlist is to be positioned and oriented and how nets are to be routed on the various layers of the IC between the cell and IC I/O terminals.

Figure 1:
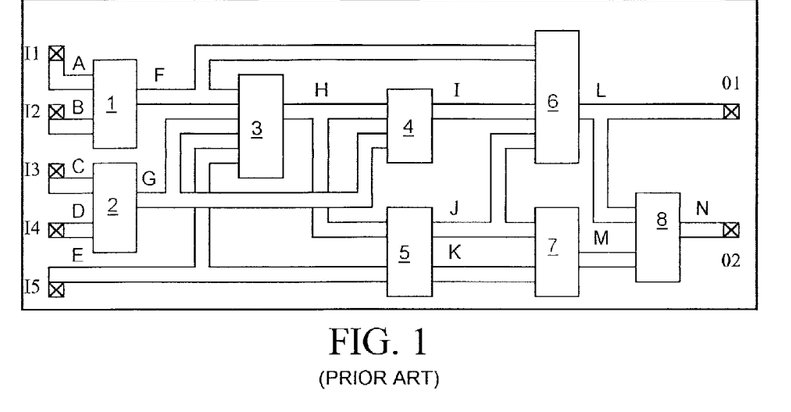
FIG. 1 is a simplified plan view of a typical prior art IC layout.

Although a typical IC can include large numbers of cells and nets, for illustrative purposes FIG. 1 shows a simplified plan view of a layout for an IC including only eight cells 1–8 and a set of fourteen nets A–N linking terminals of those cells to one another and to a set of five IC input terminals I1–I5 and two output terminals O1 and O2.

Figure 2:
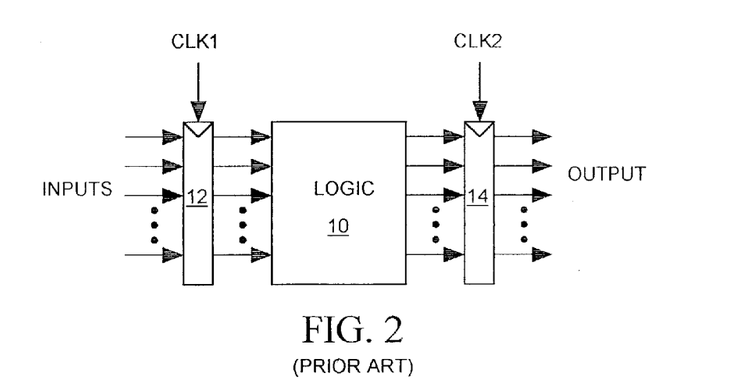
FIG. 2 is a block diagram illustrating a prior art synchronous logic circuit.

The layout produced by a P&R tool must satisfy many constraints on the IC design, including timing constraints on signal path delays. A "signal path" is formed by cells and/or conductors that logically interconnect two circuit nodes A and B such that a state change in a signal applied to node A can produce a subsequent state change at node B. Such a signal path has a timing constraint when a time delay between the change in signal states at nodes A and B must be within some maximum limit. For example, as illustrated in FIG. 2, in a synchronous logic circuit, a block of logic 10 within an IC receives all of its input signals from other parts of the IC via a register 12, and transmits all of its output signals to other parts of the IC via another register 14. The two registers 12 and 14 may be clocked by the same or different clock signals CLK1 and CLK2. One constraint on the IC design could be that logic block 10 must fully respond to a state change in any output signal of register 12 occurring on an edge of the CLK1 signal by adjusting states of the signals it supplies to register 14 before a next edge of the CLK2 signal clocking register 14. The gates and nets within logic block 10 may form many signal paths between nodes at the output of register 12 and nodes at the inputs of register 14, and each such signal path is constrained to a path delay that is less than a time difference between edges of clock signals CLK1 and CLK2.

For example if cells 1 and 2 of FIG. 1 are registers clocked by some clock signal CLK1 and cell 8 is a register clocked by another clock signal CLK2, then each of the various signal paths extending from any output of registers 1 and 2 to any input of register 8 should have a path delay no greater than a time difference between edges of the CLK1 and CLK2 signals.

After a conventional P&R tool generates an integrated circuit layout, it is often necessary for the designer to employ a computer-aided timing verification tool to compute time delays through the various signal paths within the IC to determine whether the layout meets various timing constraints on those signal paths. When path delays within one or more signal paths fail to meet timing constraints, the P&R tool will have to revise the layout to reduce delays in those signal paths.

The delay of any signal path is the sum of the delays through all gates forming that signal path and the delays through portions of the nets interconnecting those gates. The cell library typically includes information about the signal path delay through each cell, but the delays through arcs of the nets linking the cells must be estimated based on the layout of the nets. The path delay through a conductor forming a part (or "arc") of a net is usually function primarily of the resistance and capacitance components of the impedance of that particular arc. (Although the inductance of an arc also influences the path delay through an arc of a net, it does so to a lesser extent and is usually ignored when calculating path delays within an IC.) In order for a signal edge to propagate through an arc, the signal must charge or discharge the arc's capacitance, and the time required to do that is proportional to the product of its resistance and capacitance. The time required for a signal edge to propagate through an arc of a net is therefore largely a function of its length and of its resistance and capacitance per unit length. Thus for a timing analysis tool to determine how long signal edge require to propagate through any portion of a net, it is necessary for the tool to know the resistance and capacitance of the arcs forming that net.

Accordingly after a P&R tool has generated an IC layout, the designer may employ a conventional resistance/capacitance (RC) extraction tool to process the IC layout to determine the resistance and capacitance of the various arcs of each net. Each arc is conductor having an amount of resistance per unit length that is mainly a function of the cross-sectional area of the conductor and the amount of its capacitance per unit length of the conductor is a mainly a function of the width of the conductor, the distance from the conductor to nearby power and ground planes, and the dielectric constant of the insulating material between the conductor and power and ground planes. An RC extraction tool therefore may estimate the impedance of each arc based on the structure of the conductor forming the arc and on characteristics of the surrounding portions of the IC that influence its capacitance.

Figure 3:
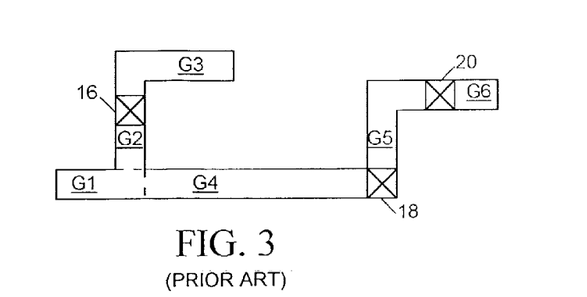
FIG. 3 is a simplified plan view of one of the nets of FIG. 1.

A net may have many arcs for which an RC extraction tool must separately calculate impedance values because various sections or branches of a net may have differing impedance environments, and because some arcs of a net may be included in some signal paths while others are not. For example FIG. 3 illustrates net G of FIG. 1 as being formed by six arcs G1–G6 for which resistance and capacitance values are separately estimated. Various vias 16 and 18 linking arcs residing on different layers may themselves be treated as separate arc. The RC extraction tool stores the resistance and capacitance data it generates for each arc of a net in a database accessible to a timing analysis tool. Since a large IC can have thousands or millions of nets, each of which may include several arcs, an RC extraction database can be very large.

Figure 4:
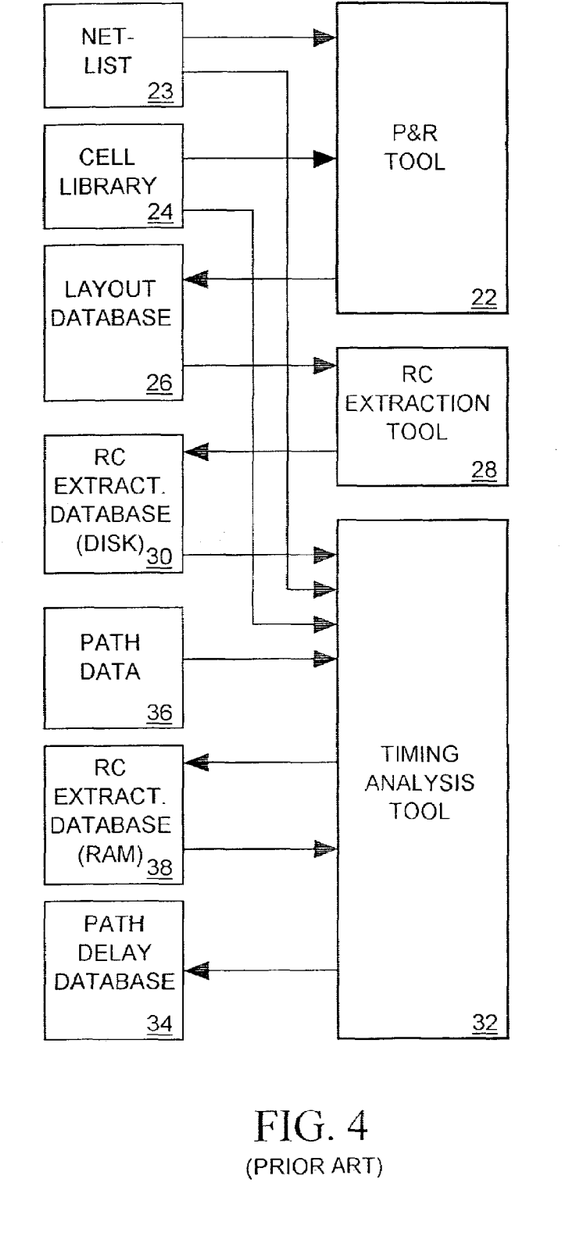
FIG. 4 is a process flow diagram illustrating a prior art process of generating an IC layout and analyzing the layout to determine delays through paths within the layout.

FIG. 4 illustrates a typical prior process of generating an IC layout and then analyzing the layout to determine delays through paths within the layout. A P&R tool 22 processes a netlist 23 and a cell library 24 to produce a layout database 26 indicating where each cell of the IC is to be positioned within an IC layout and how all nets are routed. An RC extraction tool 28, read accessing layout database 26, generates an RC extraction database 30 indicating the resistance and capacitance of each arc of each net. A timing analysis tool 32 then processes netlist 23, cell library 24 and RC extraction database 30 to generate a path delay database 34 indicating the delay though each signal path of interest referenced by path data 36 supplied as input to the timing analysis tool. The RC extraction database 30 is usually stored on a hard disk accessible to the computer programmed to act as timing analysis tool 32. But timing analysis tool 32 may generate a copy 38 of the entire RC extraction database in random access memory (RAM) before it begins calculating path delays so that whenever it requires RC extraction data for a net as it calculates path delays, it can read access the data in the RAM-based database 30 through a relatively fast RAM access, rather than from the disk-based database 30 through a relatively slow disc access.

Figure 5:
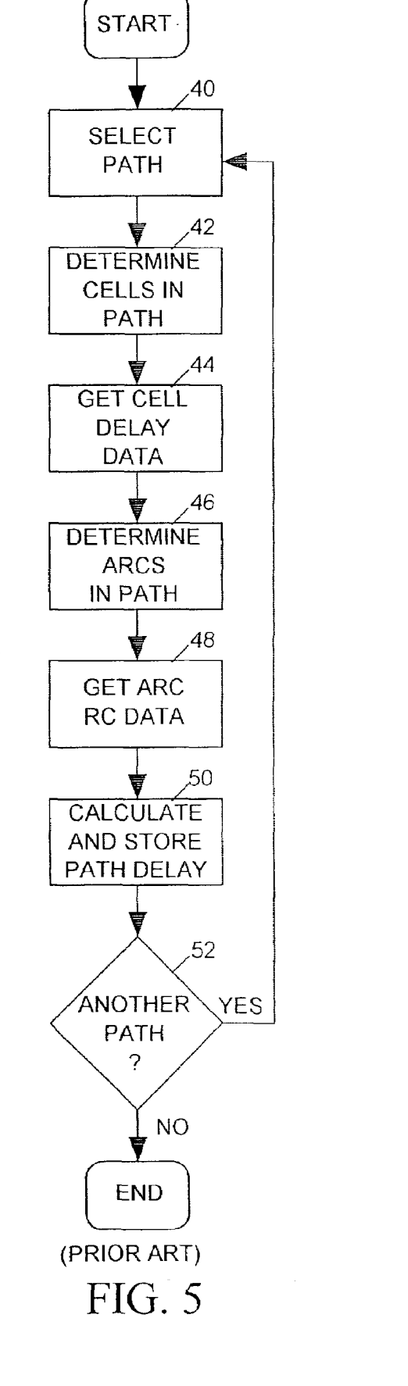
FIG. 5 is a process flow diagram illustrating the operating of the timing analysis tool of FIG. 4.

FIG. 5 illustrates how prior art analysis tool 32 of FIG. 4 accesses RC extraction data when determining signal path delays. After selecting a signal path of interest (step 40), the tool consults netlist 32 to determine which cells are included in the selected signal path, and then consults cell library 24 to determine the path delay through each cell (step 44) and to determine the input or output impedance at each cell terminal. The tool also determines which arcs are included in the selected signal path (step 46) and reads the RC data for nets containing each arc from the RC extraction database (step 48). The tool then calculates the total signal path delay based on the data obtained from the cell library and from the RC extraction database (step 50). When there is another signal path of interest (step 52), the tool selects that signal path at step 40 and then repeats steps 42–50 to acquire the RC extraction and cell data for the nets and cells forming that signal path, and to calculate the delay for that signal path. The tool continues to loop through steps 40–52 in this manner until it has computed the path delay for each signal path of interest.

Note that as the timing analysis tool 32 calculates the path delay for each signal path of interest, it may have to access the RC extraction database many times to obtain the RC extraction data for each net that may be included in the signal path. Since arcs of particular net may be included in many different signal paths, timing analysis tool 32 may have to access RC extraction database 38 for the same net many times as it calculates path delays for all of the paths incorporating parts of that net. Since a computer takes substantially more time to read access data stored on a hard disk than to read access data stored in a random access memory, that is why prior art timing analysis tool 32 may initially copy the entire disk-based RC extraction database into random access memory (RAM) to form a RAM-based RC extraction database 38 (FIG. 4). Thereafter, whenever timing analysis tool 32 needs to obtain RC extraction data for a particular net when calculating the delay through some signal path of interest, it can read the data from RAM-based RC extraction database 38 rather than from the disk-based RC extraction database 30. The timing analysis tool need only read the data for each net once out of the hard disk when generating the RAM-based version 38 of the database, even though it may thereafter need to read access the data for any particular net several times in the course of calculating path delays.

However an RC extraction database 38 for a large IC layout, such as for a deep sub-micron IC design having millions of arcs, can be so large that a computer programmed to implement a timing analysis tool may not have the memory resources the tool needs to store an copy of the entire database. When only a portion of the RC extraction database can be stored in RAM at any one time, it is may be necessary for timing analysis tool 32 to read access the disk version 30 of the database many times to obtain RC extraction data for a net included in more than one signal path of interest for which path delay is to be calculated. Therefore what is needed is a method by which a timing verification tool can calculate path delays without having to read access disk-based RC extraction data for any net more than once, and without having to create a copy of the entire database in random access memory.

BRIEF SUMMARY OF THE INVENTION

The invention relates to a method for estimating delays through selected signal paths of interest within an integrated circuit (IC) formed by cells and by nets interconnecting the cells. Each cell and various portions of each net may be included in more than one signal path of interest for which path delay is to be computed.

Although the delay through each signal path of interest is computed as a sum of path delays through each net and through each cell included in the signal path, data indicating the path delay for each signal path is initially set to indicate a zero delay through that signal path. Thereafter RC extraction data contained in a database indicating estimated impedances of all nets of the IC is sequentially read out of the database on a net-by-net basis. When the RC extraction data for a net is read out, delays through portions of that net that are included in signal paths of interest are calculated from the RC extraction data for the net, and the path data for each such signal path is incremented by the calculated delay of the portion of that net, if any, included in the signal path. The data indicating the path delay within each signal path is also incremented by an estimated path delay through each cell included in the signal path.

Thus in accordance with the invention, the RC extraction data for each net is immediately processed as it read out of the database and to determine the net's contribution to delays though every signal path including any portion of that net. Since the processing of the RC extraction data for each net of the CI occurs before the RC extraction data for a next net is read out and similarly processed, then it is necessary to read the RC extraction data for each net out of the database only once when computing estimated delays through all of the signal paths of interest, even though portions of any given net may be included in more than one of the signal paths.

When an RC extraction database is too large to reside in a the random access memory of a computer running timing analysis software for calculating signal path delays based on RC extraction data, the RC extraction database must reside on a hard disk and the computer must perform a hard disk access whenever the software requires RC extraction data. In such case the time required for the computer to read access the RC extraction data stored in the hard disk can constitute a substantial portion of the time needed to calculate path delays. By limiting the number of times the computer must access the RC extraction data for each net to once per net, rather than once per signal path including the net, the method in accordance with the invention substantially reduces processing time needed to calculate signal path delays.

The claims appended to this specification particularly point out and distinctly claim the subject matter of the invention. However those skilled in the art will best understand both the organization and method of operation of what the applicant(s) consider to be the best mode(s) of practicing the invention, together with further advantages and objects of the invention, by reading the remaining portions of the specification in view of the accompanying drawing(s) wherein like reference characters refer to like elements.

DETAILED DESCRIPTION OF THE INVENTION

The present invention relates to software stored on computer readable media which, when read and executed by a conventional computer, causes the computer to process a data file representing a layout of an integrated circuit (IC) to estimate signal path delays within the IC. Suitable computer-readable media for storing the software include (but are not limited to) compact disks, floppy disks, hard disks, and random access or read only memories. While the specification describes an exemplary embodiment of the invention considered to be a best mode of practicing the invention, the invention is not limited to that exemplary embodiment.

The invention relates to a method for estimating delays through signal paths within an integrated circuit (IC) formed by circuit components (cells) described by a cell library by nets for interconnecting cell terminals to one another and to the IC's I/O terminals. A "signal path" is formed by cells and/or portions of nets ("arcs") that logically interconnect two circuit nodes A and B such that a state change in a signal applied to node A can cause a subsequent state change at node B. Each arc of a net that forms a part of a signal path has a resistive and capacitive impedance that delay signal edges passing through the arc. Each cell included in a signal path has input and output impedances and an internal delay that add to the signal path delay. A separate path delay value can be computed for each signal path by setting the path delay value to a sum of delays through each arc and cell included in the signal path.

The signal path delay of each arc of a signal path can be computed from its impedance, and a conventional resistance/capacitance (RC) extraction tool can estimate the impedance of arcs of all nets of an IC by analyzing the layout of an IC. A conventional RC extraction tool stores the RC extraction tool describing the impedance of each arc of a net in a database residing on a hard disk.

A timing analysis tool for computing delays within various signal paths of the IC in accordance with the invention, initially zeros a set of data values, each representing the path delay though a separate signal path of interest within the IC for which path delay is to be estimated. The timing analysis tool then reads the RC extraction data for each net from the database on a net-by-net basis. After reading the RC extraction data for any given net of the IC, and before reading the RC extraction data for a next net, the timing analysis tool determines input and output impedance characteristics of cells linked to the net and processes the impedance data for the net and cells in a conventional manner to determine an estimated delay through each portion of the net that is included in any of the signal paths of interest. The timing analysis tool then increments the data value representing the estimated path delay of every signal path of interest within the IC that includes a section of the net by the estimated delay through that net section. Thereafter the tool accesses and processes the RC extraction data for a next net of the IC and the impedance and delay data for the cells connected to it in a similar manner to increment the path delay data for each signal path including portions of that next net or cells connected to that net. When RC extraction data for all of the nets of the IC and the impedance and delay data for cells linked to them and impedance and delay data for of the have been processed in this manner, the delay data value for each signal path of interest will indicate an estimated path delay though that signal path.

Using this approach, a timing analysis tool need read access the RC extraction data in the database for each net only once when computing estimated delays through all of the signal paths of interest, even though one portions of that net may be included in more than one of the signal paths. When the RC extraction database is so large that it must remain on a hard disk and cannot be stored in its entirety in random access memory during the process, the method speeds up processing time by minimizing the number of hard disk accesses the timing analysis tool must perform.

Figure 6:
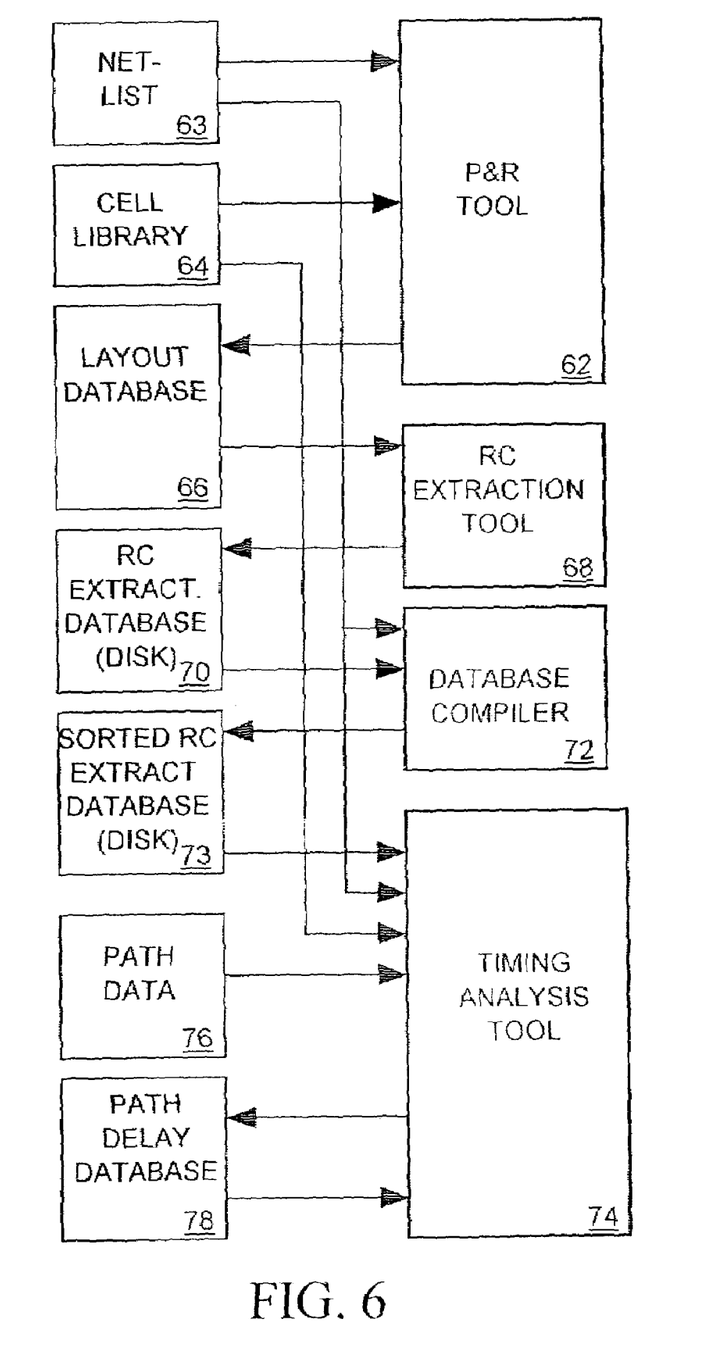
FIG. 6 is a process flow diagram illustrating process of generating an IC layout and analyzing the layout to determine delays through paths within the layout in accordance with the invention.

FIG. 6 is a data flow diagram illustrating a process in accordance with the invention for designing the layout of an IC and for analyzing that layout to estimate delays in various signal paths within the IC. A netlist 63 references all of the cells that are to form the IC and indicates which of the cells' terminals are to be connected to one another and to the IC's input/output (I/O) terminals via nets. A cell library 64 describes the layout of each cell that may be incorporated into the IC, indicates the impedance at each of the cell's input and output terminals, and provides data indicating estimated signal path delays between the cell's terminals. A conventional placement and routing (P&R) tool 62 processes netlist 63 and cell library 64 to produce a layout database 66 indicating where and how each cell of the IC is to be positioned and oriented within the IC's semiconductor substrate and indicating how all nets are to be routed between the cell terminals and the IC's I/O terminals.

A conventional RC extraction tool 68 processes layout database 66 to produce a random access RC extraction database 70 indicating the resistance and capacitance impedances of each arc of each net of the IC. Database 70, which may be very large, is suitably stored on a hard disk. A database compiler 73 then converts the random access RC extraction database 70 into a serial RC extraction database 73 in which the RC extraction data for the nets is sorted in a particular manner as explained below. Database 73, which may be very large, is suitably stored on a hard disk. A timing analysis tool 74 in accordance with the invention then processes netlist 63, cell library 64 and serial RC extraction database 73 to estimate a delay though each signal path of interest referenced by path data 76 supplied as input to timing analysis tool 74. Timing analysis tool 74 stores data indicating the estimated delay for each path in a path delay database 78.

Based on an analysis of netlist 63, database compiler 72 orders the RC data stored in serial RC extraction database 73 for each net in accordance with the topological order in which the signals the nets carry logically affect one another. The nets carrying signals applied to the IC's I/O terminals are considered "first level" or "primary" nets. For example since nets A–E of FIG. 1 convey the IC's input signals, those nets are considered to be the IC's first level nets. The IC's second level nets are those nets conveying signals having states that are affected only by signals conveyed on first level nets. The output nets F and G of cells 1 and 2 of FIG. 1 are second level nets because they convey signals that are affected only by signals conveyed on first level nets A-D. Third level nets convey signals that are affected only by signals by lower order (first and second level) nets. Net H of FIG. 1 is a third level net because the signal its conveys is affected only by signals conveyed on first level net E and second level nets F and G. Nets I, F and K are fourth level nets because their signals are affected only by signals conveyed by nets residing at lower levels. Nets L and M are fifth level nets, and net N is a sixth level nets.

After processing netlist 63 to determine the level of each net, database compiler 72 read accesses the RC extraction database 70 to obtain the RC extraction data for the nets in the topological order of the nets described above and writes those records into the serial RC extraction database 73 in that same order.

Figure 7:
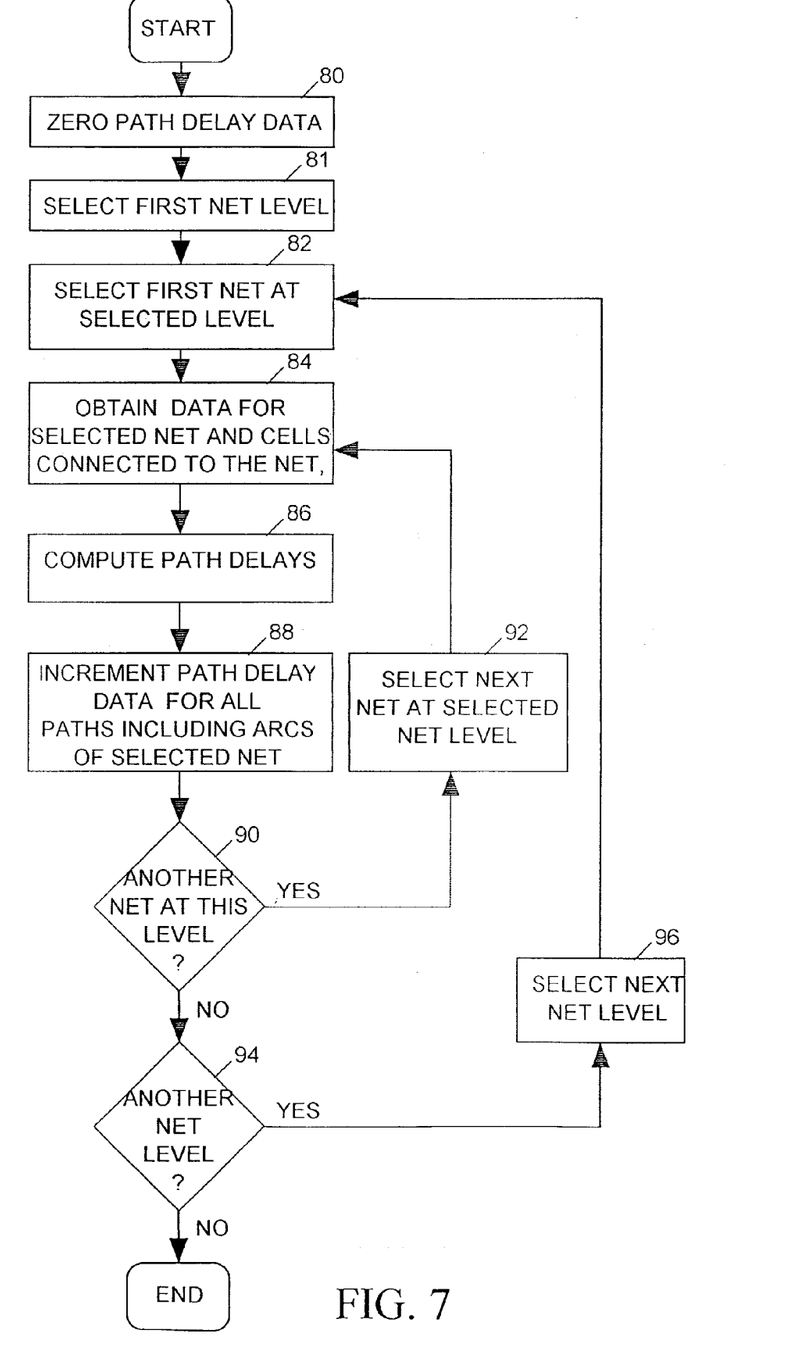
FIG. 7 is a process flow diagram illustrating the operating of the timing analysis tool of FIG. 4 in accordance with the invention.

FIG. 7 illustrates the method for calculating path delays carried out by timing analysis tool 74 of FIG. 6. Path delay database 78 of FIG. 6 stores data representing a path delay though each signal path of interest in the IC. Initially the timing analysis tool zeros the path delay data for each signal path (step 80). The timing analysis tool then selects a first (primary) net level (step 81), selects a first net at that selected level (step 82), and thereafter reads the RC data for all arcs forming the selected net. At step 84 the timing analysis tool also determines from the netlist which cells are connected to the selected net and accesses the cell library to obtain input and output impedances and path delays of those cells. Timing analysis tool 74 next (step 86) computes the delay through each section of the selected net that is included in any one of the signal paths of interest based on the RC extraction and impedance data acquired at step 84. The tool then increments the path delay data in database 78 for each signal path of interest including any section of that first primary net by the calculated delay through that section of the net and by the path delay through any cell connected to the net that forms a part of the signal path (step 88).

For the example IC layout of FIG. 1, timing analysis tool 74 first selects primary net A at step 82 since that net's RC extraction data appears first in the serial RC extraction database 73. At step 84, the tool then reads the RC extraction data for net A and also accesses the cell library to determine the input impedance of cell 1 at the terminal connected to net A and to determine the path delay through cell 1 between that input terminal and the cell output terminal connected to net F. At step 86 the tool computes the path delays through net A from the RC extraction data in the input impedance of cell 1. At step 89, the tool adds the computed delay through net A and the delay though cell 1 to the path delay data for each signal path that includes net A and cell 1. Thus, for example, if the signal path between input terminal 11 and output terminal $O_2$ formed by gates 1, 3, 4, 6 and 8, and nets A, F, H, I, L and N is one of the paths for which signal path delay is to be calculated, the data in path delay database 78 for that signal path will at this point indicate the total delay from input terminal I1 to the net F output of cell 1. If net A and cell 1 are included in any other signal paths for which path delay is to be calculated, then the path data stored in path delay database 78 for those signal paths is also incremented by a similar amount at step 88.

When the IC includes another net at the selected level (step 90), timing analysis tool 74 selects the next net at the selected level (92), obtains the impedance and cell delay data for that net and for the cells connected to that net from the RC extraction data base and cell library (step 84), calculates path delays through that net (step 86) and then appropriately increments the path delay data for each path containing any portion of that net (step 88). Timing analysis tool 74 continues to loop through steps 82–92 until it has read and processed the RC extraction data for all first level nets. When there are nets at a next higher level (step 94), the tool selects that next higher net level at step 96 and then repeats steps 82–92 to sequentially read and process the RC extraction data for all nets at that level. After the timing analysis tool repeats steps 82–92 once for each net level, it will have read and processed the RC extraction data once for every net of the layout, and the data stored in path delay data base 78 for each signal path of interest will indicate the sum of delays through every net and every cell forming that signal path.

In the example layout of FIG. 1, the timing analysis tool would sequentially read and process the RC data for the nets and cells in order A–N.

As discussed above, the prior art approach to computing path delays illustrated in FIG. 5 computes the delay though each signal path of interest before computing the path delay through a next signal path of interest. Hence when portions of any particular net are included in several paths of interest, a prior art timing analysis tool must read access the RC data for that net several times. If the random access memory of the computer implementing the timing analysis tool is not large enough to hold the entire RC extraction database, then the timing analysis tool will have to make several, relatively slow, disk accesses for each arc that is included in more than one signal path for which path delay is to be estimated.

Disk accesses require substantially more processing time than RAM accesses, and when a timing analysis tool needs to read access a disk drive whenever it needs to obtain RC extraction data for a net, the amount of time a timing analysis tool needs to read RC extraction data from a disk drive can be a substantial portion of the total time required to calculate path delays for an IC. Since a timing analysis tool in accordance with the invention reads the RC data for each net out of the RC extraction database 73 and calculates delays on a net-by-net basis rather than on a path-by-path basis, it need read the RC extraction data for each net only once, even though sections of that net may be included in many signal paths of interest. The net-by-net approach in accordance with the invention is therefore particularly advantageous over the prior art path-by-path approach when the RC extraction database is so large that it cannot be stored in its entirety in random access memory (RAM).

Note also that timing analysis tool 74 reads the RC extraction data out of database 73 in the topological order in which the data appears in the RC extraction database. It is usually much quicker for a computer to read access a serial database than a random access database, provided the data to be accessed appears in the serial database in the order in which it is to be read. Thus by converting the random access RC extraction database 70 into the serial RC extraction database 73, database compiler 72 helps to further reduce the amount of time timing analysis tool 74 needs to access RC extraction data. Although database compiler 72 is shown as a separate process, in alternative embodiments of the invention, the function of database compiler 72 can be merged with that of RC extraction tool 68 by adapting the RC extraction tool 68 to analyze and generate a serial RC extraction database organized in the appropriate topological order.

In other embodiments of the invention, timing analysis tool 32 may directly obtain RC extraction data for the nets from random access RC extraction database 70, thereby eliminating the step of converting the random access data into the pre-sorted, serial database 73. That embodiment of the invention will still require timing analysis to 32 to read access the RC data for each net only once even though portions of a net may be included in many signal paths of interest.

Since a timing analysis tool implementing the method in accordance with the invention need process the RC extraction data only once for each net, it is neither necessary nor helpful for the tool to write the entire RC extraction database into RAM prior to calculating path delays. Accordingly the amount of RAM provided for storing RC extraction data need be no larger than that needed to store the RC extraction data for the largest net (the net having the greatest number of arcs) in the design. The invention thus enables a timing analysis tool to calculate path delays with about the same speed as a prior art timing analysis tool that stores the entire RC extraction database in memory, without requiring the use of such a large amount of random access memory resources for storing RC extraction data.

The foregoing specification and the drawings depict exemplary embodiments of the best mode(s) of practicing the invention, and elements or steps of the depicted best mode(s) exemplify the elements or steps of the invention as recited in the appended claims. However the appended claims are intended to apply to any mode of practicing the invention comprising the combination of elements or steps as described in any one of the claims, including elements or steps that are functional equivalents of the example elements or steps of the exemplary embodiment (s) of the invention depicted in the specification and drawings.

What is claimed is:

1. A method for generating path delay data representing an estimated signal path delay through each of a plurality of signal paths within an integrated circuit (IC), wherein the IC includes a plurality of cells and a plurality of nets for conveying signals between the cells, the method comprising the steps of:
   a. selecting one of the nets;
   b. reading RC extraction data indicating an estimated impedance of each section of the net selected at step a from a database storing RC extraction data indicating an estimated impedance of each section of each of the plurality of nets, and computing as a function of the read RC extraction data, an estimated path delay through each section of the net selected at step a that is included in at least one of the plurality of signal paths; and
   c. adjusting the path delay data for each one of the plurality of signal paths that includes a section of the net selected at step a by incrementing an estimated signal path delay that the path delay data represents by an amount of the estimated path delay through that section of the net computed at step b.

2. The method in accordance with claim 1 further comprising the step of:
   d. repeating steps a through c in succession a plurality of times with a separate one of the plurality of nets being selected at step a during each repetition of steps a through c.

3. The method in accordance with claim 2 wherein at least one of the plurality of signal paths also includes at least one of the plurality of cells, and wherein the method further comprises the steps of:
   e. determining an estimated path delay through each of the plurality of cells included in at least one of the signal paths of interest, and
   f. for each one of the signal paths, adjusting the path delay data representing the path delay in that signal path to increment the path delay it represents by an amount equal to an estimated path delay determined at step d of each one of the plurality of cells included in that signal path.

4. The method in accordance with claim 1 further comprising the step of:
   d. repeating steps a through c in succession once for each of the plurality of nets with a separate one of the plurality of nets being selected at step a during each repetition of steps a through c.

5. The method in accordance with claim 4 further comprising the step of
   e. prior to step a, generating the database, wherein the database is a serial database that stores RC extraction data as a data sequence and reads out the RC extraction data only in an order in which it appears in the stored data sequence.

6. The method in accordance with claim 5 wherein the RC extraction database resides on a hard disk during each repetition of step a.

7. The method in accordance with claim 4 wherein each net conveys a separate signal, and wherein each cell receives at least one input signal conveyed on at least one of the nets and generates at least one output signal of a state affected by the cell's at least one input signal, the output signal being conveyed on at least one other of the nets, and
   wherein nets are selected during successive repetitions of step a in an order such that each particular net is selected only after all other nets conveying signals affecting states of the signal conveyed by the particular net have been selected.

8. The method in accordance with claim 7 further comprising the step of:
   e. prior to step a, generating the database, wherein the database is a serial database that stores RC extraction data as a data sequence and reads out the RC extraction data only in an order in which it appears in the stored data sequence.

9. Computer readable media storing software which when read and executed by a computer, causes the computer to carry out a method for generating path delay data representing an estimated signal path delay through each of a plurality of signal paths within an integrated circuit (IC), wherein the IC includes a plurality of cells and a plurality of nets for conveying signals between the cells, wherein the method comprises the steps of:

a. selecting one of the nets, b. reading RC extraction data indicating an estimated impedance of each section of the net selected at step a from a database storing RC extraction data indicating an estimating impedance of each section of each of the plurality of nets, and computing as a function of the read RC extraction data, an estimated path delay through each section of the net selected at step a that is included in at least one of the plurality of signal paths; and    c. adjusting the path delay data for each one of the plurality of signal paths that includes a section of the net selected at step a by incrementing an estimated signal path delay that the path delay data represents by an amount of the estimated path delay through that section of the net computed at step b.

10. The computer readable media in accordance with claim 9 where the method further comprises the step of:

d. repeating steps a through c in succession a plurality of times with a separate one of the plurality of nets being selected at step a during each repetition of steps a through c.

11. The computer readable media in accordance with claim 10 wherein the method further comprises the step of:

d. repeating steps a through c in succession once for each of the plurality of nets with a separate one of the plurality of nets being selected at step a during each repetition of steps a through c.

12. The computer readable media in accordance with claim 11 wherein the method further comprises the step of:

e. prior to step a, generating the database, wherein the database is a serial database that stores RC extraction data as a data sequence and reads out the RC extraction data only in an order in which it appears in the stored data sequence.

13. The computer readable media in accordance with claim 12 wherein the RC extraction database resides on a hard disk accessed by the computer during each repetition of step a.

14. The computer readable media in accordance with claim 11 wherein each net conveys a separate signal, and wherein each cell receives at least one input signal conveyed on at least one of the nets and generates at least one output signal of a state affected by the cell's at least one input signal, the output signal being conveyed on at least one other of the nets,    wherein nets are selected during successive repetitions of step a in an order such that each particular net is selected only after all other nets conveying signals affecting states of the signal conveyed by the particular net have been selected.

15. The computer readable media in accordance with claim 14 wherein the method further comprises the step of:

e. prior to step a, generating the database, wherein the database is a serial database that store RC extraction data as a data sequence and reads out the RC extraction data only in an order in which it appears in the stored data sequence.

16. The computer readable media in accordance with claim 10 wherein at least one of the plurality of signal paths also includes at least one of the plurality of cells, and wherein the method further comprises the steps of:

e. determining an estimated path delay through each of the plurality of cells included in at least one of the signal paths of interest, and    f. for each one of the signal paths, adjusting the path delay data representing the path delay in that signal path by incrementing the path delay it represents by an amount equal to an estimated path delay determined at step d of each one of the plurality of cells included in that signal path.

\* \* \* \* \*